US006863485B2

(12) United States Patent
Mizokawa et al.

(10) Patent No.: US 6,863,485 B2
(45) Date of Patent: Mar. 8, 2005

(54) CONVEYANCE SYSTEM

(75) Inventors: Takumi Mizokawa, Tokyo (JP); Makoto Omori, Aichi (JP); Yuzo Takakado, Aichi (JP); Hitoshi Kawano, Mie (JP)

(73) Assignee: Shinko Electric Co., Ltd., Tokyo (JP)

(*) Notice: Subject to any disclaimer, the term of this patent is extended or adjusted under 35 U.S.C. 154(b) by 0 days.

(21) Appl. No.: 09/490,507

(22) Filed: Jan. 25, 2000

(65) Prior Publication Data
US 2002/0150447 A1 Oct. 17, 2002

(30) Foreign Application Priority Data

Jan. 27, 1999 (JP) .............................. 11-019034
Apr. 27, 1999 (JP) .............................. 11-120563

(51) Int. Cl.⁷ .............................................. B65G 49/07
(52) U.S. Cl. ....................................... 414/217; 414/935
(58) Field of Search ....................... 414/222.13, 225.01, 414/226.05, 217

(56) References Cited

U.S. PATENT DOCUMENTS

| 4,624,617 A | * | 11/1986 | Belna .......................... 414/347 |
| 5,002,455 A | * | 3/1991 | Kuriyama et al. .......... 414/750 |
| 5,417,537 A | * | 5/1995 | Miller ......................... 414/217 |
| 5,442,416 A | * | 8/1995 | Tateyama et al. ........... 354/319 |
| 5,844,662 A | * | 12/1998 | Akimoto et al. .............. 355/27 |
| 6,053,687 A | * | 4/2000 | Kirkpatrick et al. ... 414/222.13 |
| 6,091,498 A | * | 7/2000 | Hanson et al. .............. 356/375 |
| 6,230,721 B1 | * | 5/2001 | Miyasako ..................... 134/61 |
| 6,235,634 B1 | * | 5/2001 | White et al. ................. 438/680 |

FOREIGN PATENT DOCUMENTS

| JP | 4-288812 A | 10/1992 |
| JP | 7-211763 A | 8/1995 |
| WO | 98/19733 | * 7/1998 |

* cited by examiner

Primary Examiner—James W. Keenan
(74) Attorney, Agent, or Firm—Brinks Hofer Gilson & Lione

(57) ABSTRACT

Wafer processing apparatus A–Z for performing processes A–Z on a wafer are arranged in a row. A chamber 14 is formed parallel to these wafer processing apparatus, and a guide rail 11 is provided inside the chamber 14. A mobile element 12 driven by means of a linear motor is provided on the guide rail 11, and a wafer transfer robot 13 capable of exchanging a wafer between the wafer processing apparatus is mounted on the mobile element 12. With this structure, the wafer transfer robot 13 exchange wafers between wafer processing apparatus to perform each process on the wafers until the wafers are conveyed to the wafer processing apparatus Z.

11 Claims, 12 Drawing Sheets

CONVEYANCE SYSTEM

BACKGROUND OF THE INVENTION

1. Field of the Invention

The present invention relates to a conveyance system for conveying one or more wafers between a plurality of wafer processing apparatus.

2. Description of the Related Art

The processes for manufacturing IC's and LSI require a lot of processing of wafers. Therefore in the processes for manufacturing IC's and LSI sequentially, wafers are conveyed to the processing apparatus for performing each process. Here, FIG. 1 is a schematic plan view showing an equipment for a lot of processing of wafers. In the drawing, the production equipment sequentially performs processes A–Z on the wafers, and the wafer processing apparatus A, wafer processing apparatus B, . . . , wafer processing apparatus Z are arranged as shown. These wafer processing apparatus are provided with stockers SA, SB, . . . , SZ for each processing apparatus. Each stocker houses a plurality of cassettes capable of accommodating 10–20 stacked wafers. Additionally, n (n is a natural number) wafer processing apparatus A1–An are arranged in a row. And n (n is a natural number) wafer processing apparatus B, . . . , Z are arranged in the same as the n wafer processing apparatus A1–An. And in the drawing, the wafer processing apparatus are numbered from 1 to n. A rail AR, BR, . . . , ZR from the stocker corresponding to each wafer processing apparatus are provided parallel to the n aligned wafer processing apparatus. The rail AR, BR, . . . , ZR are arranged for guiding an in-process cassette transfer apparatus which is not shown, and for performing in-process cassette conveyance.

With this structure, a cassette transfer apparatus traveling along the rail AR withdraws a cassette from the stocker SA, moves over the rail AR, and places the cassette in front of the wafer processing apparatus A1. Then, when this type of cassette transfer operation has been performed with respect to n wafer processing apparatus A and the cassette transfer operation has ended, as shown in FIG. 2, a cassette 4 housing a plurality of stacked wafers is positioned in front of n wafer processing apparatus A. A wafer transfer apparatus 2 is arranged between the cassette 4 and the wafer processing apparatus A. The wafer transfer apparatus 2 takes out a wafer in the cassette 4 and sets it in the wafer processing apparatus A. Then, after the set wafer has undergone the process A by the wafer processing apparatus A, the A-processed wafer is extracted from the wafer processing apparatus A by means of the wafer transfer apparatus 2, and rehoused inside the cassette 4. When this type of process has been performed with respect to every wafer in cassette 4, they are returned to the stocker SA by means of the in-process cassette transfer apparatus which travels along the rail AR shown in FIG. 1. The in-process cassette transfer apparatus performs the action of returning the cassette 4 containing the A-processed wafers to the stocker SA with respect to n wafer processing apparatus A1–An.

The cassette 4 in which wafers which have undergone the process A has been housed is moved from the stocker SA to the stocker SB provided in correspondence to the wafer processing apparatus B. Here, the movement of the cassette 4 between stockers is performed by means of an inter-process cassette transfer apparatus not shown. The inter-process cassette transfer apparatus is provided movably on the rail SR provided parallel to each stocker in the left-right direction in the drawing. This inter-process cassette transfer apparatus withdraws the cassette 4 from the stocker corresponding to the wafer processing apparatus of the previous stage, moves to the position in front of a stocker corresponding to the wafer processing apparatus of the next step, and houses the cassette 4 in this stocker. In this way, the cassette 4 is moved between stockers.

When the cassette 4 is moved from the stocker SA to the stocker SB by the inter-process cassette transfer apparatus as described above, the cassette 4 is sequentially conveyed from the stocker SB in front of the n wafer processing apparatus B by means of the in-process cassette transfer apparatus which travels along the rail BR. Then, the wafer transfer apparatus provided for each wafer processing apparatus B takes out one wafer at a time from the cassette 4 as in the case of the process A described above, sets it in the wafer processing apparatus B, to perform the process B by means of the wafer processing apparatus B. Then, the B-processed wafers are once again returned to the cassette 4, and when all of the B-processed wafers have been accommodated into the cassette 4, the cassette 4 is returned from in front of the n wafer processing apparatus B to the stocker SB by means of the in-process cassette transfer apparatus. LSI and IC's are produced by repeating this type of operation until the process Z.

However, in the semiconductor producing equipment described above, it is not possible to go on to process B until process A has been completed with respect to all of the wafers housed in the cassette 4 housed in the stocker, thus requiring a large amount of time to produce semiconductors which necessitate a large number of processing steps. Additionally, during the period from when the process A has been performed until the next process B is performed, the processed wafers are left for a long time inside the cassette 4. For example, if the wafers are left for a long time after performing a wafer cleansing process before going on to the next coating process, dust may adhere to the wafers or the wafers may oxidize, thus reducing the yield.

Additionally, with the above-described production equipment, although the production time is not a problem when performing mass production of the same type of product, in the case of small-scale production of prototype or different types of products, then the same amount of production time is required as with mass production even though the number produced is small. That is, a large amount of time is required to produce prototype or small-scale production products. Additionally, since a large number of transfer apparatus such as in-process cassette transfer apparatus, inter-process cassette transfer apparatus and wafer transfer apparatus are required, the cost of equipment production becomes large, thereby increasing the production cost of the final product.

BRIEF SUMMARY OF THE INVENTION

The present invention provides a conveyance system for semiconductor production equipment capable of reducing the production time and increasing the yield, while reducing the production cost.

In an aspect of the present invention, the conveyance system for conveying one or more wafers between a plurality of wafer processing apparatus having wafer exchange positions, comprising a guide rail provided between the wafer exchange positions of the plurality of wafer processing apparatus; a mobile element provided so as to be capable of moving along the guide rail; and a wafer exchange element provided on the mobile element, capable of holding a wafer at a time, and exchanging a wafer at a time with other apparatus capable of exchanging a wafer; wherein a wafer is received from one of the wafer processing apparatus by the wafer exchange element, the wafer processed by the wafer processing apparatus is held by the wafer exchange element, the mobile element moves to the wafer exchange position of a wafer processing apparatus to perform a next process on the held processed wafer, and the wafer held by the wafer exchange element is transferred to the wafer processing apparatus to perform the next process.

According to the present invention, it is possible to reduce the production time in semiconductor producing equipment. Additionally, the yield can be increased and the production costs decreased.

DETAILED DESCRIPTION OF PREFERD EMBODIMENTS

Hereunder embodiments of the present invention shall be explained with reference to the drawings.

A. First Embodiment

A-1. Wafer Conveyance System

Figure 3:
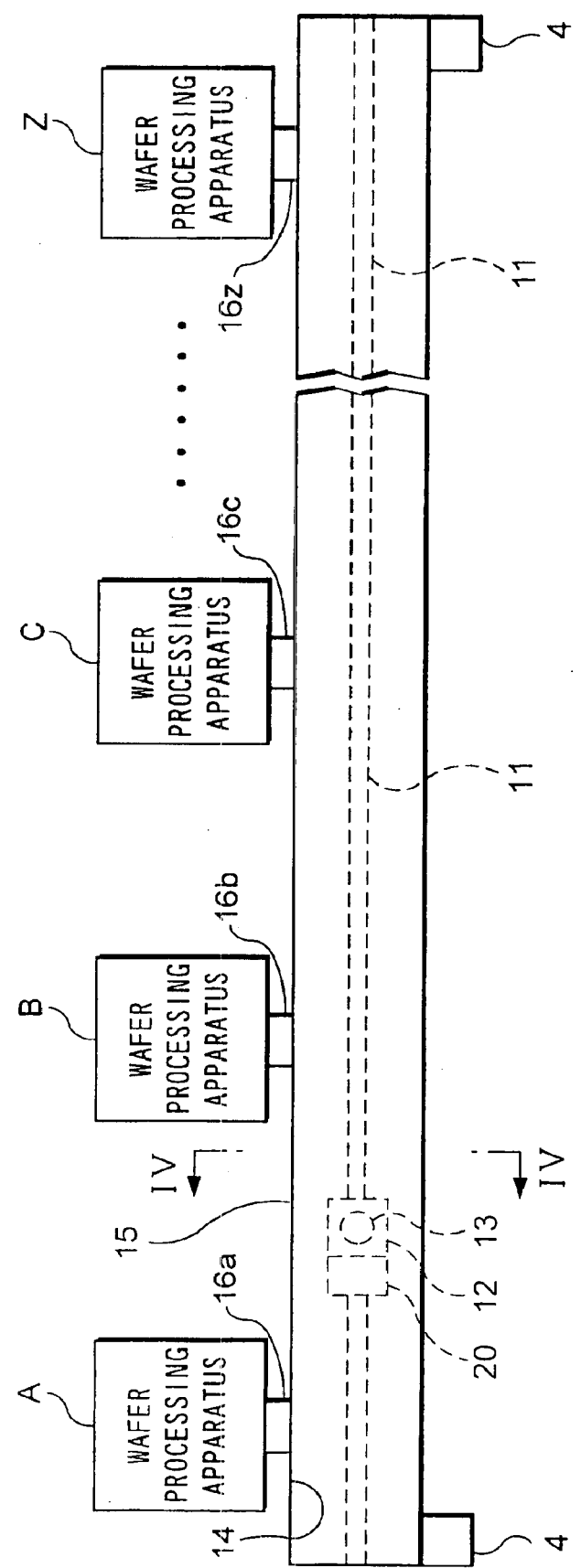
FIG. 3 is a schematic plan view showing semiconductor production equipment provided with a wafer conveyance system according to a first embodiment of the present invention.

First, FIG. 3 is a schematic plan view of semiconductor production equipment provided with a wafer conveyance system according to a first embodiment of the present invention. As shown in FIG. 3, it is possible to perform the processes A, B, C, . . . , Z on the wafers with this semiconductor production equipment. The wafer processing apparatus A, wafer processing apparatus B, wafer processing apparatus C, . . . , wafer processing apparatus Z for performing these processes are arranged linearly in the left-right direction of the diagram.

In front of each wafer processing apparatus (bottom of FIG. 3), a roughly box-shaped chamber 14 is formed. The chamber 14 is formed in parallel to the direction of alignment of the wafer processing apparatus. Inside the chamber 14, a guide rail 11 is provided along the longer side of the chamber 14, and a mobile element 12 is provided movably along this guide rail 11. This mobile element 12 has attached a wafer transfer robot (wafer exchange element) 13. The wafer transfer robot 13 is capable of holding a wafer at a time, and capable of moving a held wafer within a predetermined range. The wafer transfer robot 13 moves along the guide rail 11 in conjunction with the movement of the mobile element 12. Additionally, on the movable direction (right-left direction in FIG. 3) side of the mobile element 12, a controller unit 20 having a controller for controlling the actions of this mobile element 12 is attached.

At both ends of the chamber 14 in the longer side, cassettes 4 each capable of housing a plurality of stacked wafers are positioned. Due to the mobile element 12 moving near the cassette 4, the wafer transfer robot 13 is enabled to withdraw a wafer from the cassette 4. Additionally, a wafer insertion portion of each wafer processing apparatus is connected to the chamber 14 by means of a duct 16a, 16b, 16c, . . . , 16z. As a result, the wafer transfer robot 13 is able to exchange wafers between wafer processing apparatus inside a sealed space including the chamber 14 and duct 16a.

Figure 4:
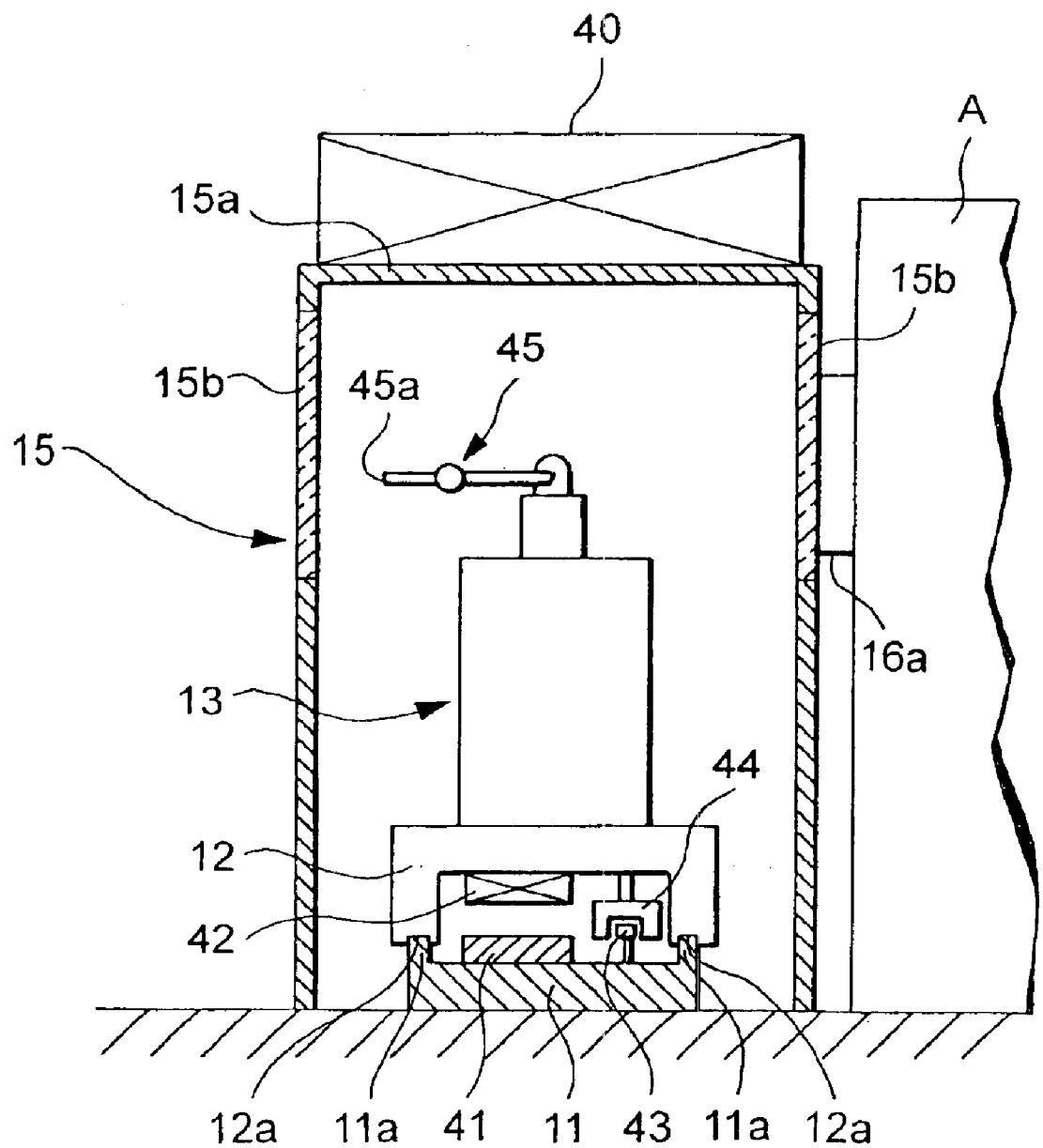
FIG. 4 is a view as viewed along a line IV—IV in FIG. 3.

FIG. 4 is a view as viewed along the line IV—IV in FIG. 3. As shown in FIG. 4, the chamber 14 is formed by means of partition panels (space forming element) 15. FFU (fan filter units) 40 are provided on top of the roof panel 15a of the partition panel 15. The FFU 40 send a large amount of air of high cleanliness through a ventilation port formed in the roof panel 15a. As a result, the chamber 14 is a space of higher cleanliness than the outside. That is, the inside of the chamber 14 is a local clean room. Additionally, a transparent material is used for the portion 15b of the partition panel 15 forming the chamber 14 which is at the height of the top portion (around the arm to be described later) of the wafer transfer robot 13. As a result, a supervisor can check on whether the wafer transfer robot 13 is operating normally from outside the chamber 14.

A guide rail 11 is provided (refer to FIG. 3) at the bottom portion of the chamber 14, and a magnet (first magnetic field generating element) 41 is provided on this guide rail 11. Additionally, a projection 11a projects upward from both ends of the guide rail 11. A depression 12a is formed in the mobile element 12. The depression 12a of the mobile element 12 is slidably adapted in this projection 11a. As a result, the mobile element 12 is enabled to move along the guide rail 11. A magnetizing coil (second magnetic field generating means) 42 is attached on the bottom surface of the mobile element 12 at a position opposite to the magnet 41, this providing the propulsive force for moving the mobile element 12 together with the magnet provided on the guide rail 11. That is, the mobile element 12 is driven by a linear motor composed of the magnet 41 and the excitation coil 42.

Additionally, the guide rail 11 is provided with an electricity supply line 43 along the direction of movement of the mobile element 12 along the guide rail 11 (the direction perpendicular to the plane of the paper in FIG. 4). On the other hand, on the bottom surface of the mobile element 12, C-shaped electricity receiving coil (electricity receiving element) 44 is provided so as to cover three sides of the electricity supply line 43. With this composition, when an electric current is supplied to the electricity supply line 43, an electromotive force is created at the electricity receiving coil 44 by means of the magnetic field generated around the electricity supply line 43. This electromotive force is supplied to the power supply circuit and controller to be described later. In this way, an electric power is supplied to the power supply circuit of the mobile element 12, and this power magnetizes the excitation coil 42. Thus, in the present embodiment, the electric power is supplied without contact with the mobile element 12.

A wafer transfer robot 13 is attached to the top portion of the mobile element 12. The wafer transfer robot 13 has an arm 45 which can freely move up, down, left or right and is capable of rotating. At the tip portion of this arm 45, a holding portion 45a capable of holding a wafer at a time is provided. With this structure, the wafer transfer robot 13 is capable of entering the holding portion 45a from the chamber 14 through the duct 16a and into a wafer insertion portion of each wafer processing apparatus. By entering the holding portion 45a into the wafer insertion portion of the wafer processing apparatus in this way, the exchange of one wafer at a time between each wafer processing apparatus can be performed. Here, the wafer transfer robot 13 is capable of exchanging wafers with a high degree of precision (for example, a precision of about 50 μm), so as to be able to reliably set a wafer to the wafer insertion portion of each wafer processing apparatus.

While FIG. 4 shows a case wherein the guide rail 11 is set at the bottom portion of the chamber 14, the invention is not so restricted, and the guide rail 11 and magnet 41 forming the linear motor may, for example, be provided on the side portion of the chamber 14. Additionally, while the supply of power to the mobile element 12 is performed without contact using the electricity supply line 43 and the electricity receiving coil 44, the power supply can be done by cable using cable bearers if the distance of movement of the mobile element 12 is short. Furthermore, while the magnet 41 is provided above the guide rail 11, the invention is not so restricted, and it is possible to move the mobile element 12 along the guide rail 11 using various known types of linear motors. For example, it is possible to position a lattice panel on top of the guide rail, and generate a propulsive force with the excitation coil 42 of the mobile element 12 by means of the principles of the linear motor.

Figure 5:
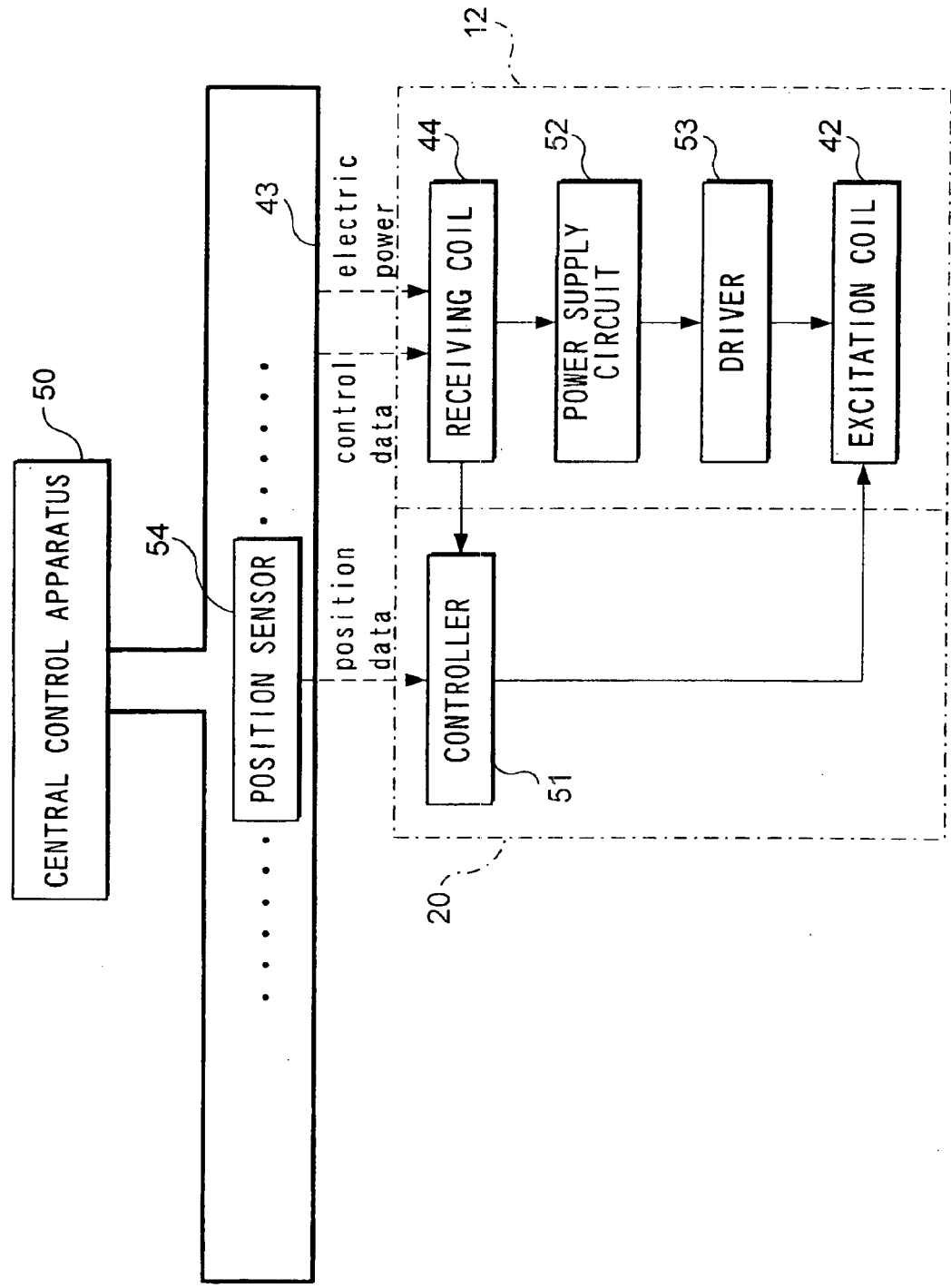
FIG. 5 is a block diagram showing the structure of a control system in a wafer conveyance system according to the first embodiment.

Next, the control system for this wafer conveyance system shall be explained using FIG. 5. As shown in FIG. 5, this control system is controlled by a central control apparatus (control element) 50. This central control apparatus 50 supplies an electric current containing control data signals to the electricity supply line 43. For example, it can supply an electric current having amplitudes or the like corresponding to the control data. The control data supplied to the electricity supply line 43 in this way is received on the mobile element 12 by the electricity receiving coil 44. The received control data is supplied to the controller 51 provided in the controller unit 20. Additionally, as mentioned above, the electric power acquired by the electricity receiving coil 44 without contact from the electricity supply line 43 is supplied to the driver 53 after voltage regulation at the power supply circuit 52. The controller 51 controls the driver 53 based on the control data from the central control apparatus 50 and position data of the mobile element 12 supplied from a plurality of position sensors (mobile element detecting sensors) 54 positioned along the guide rail 11. In the present embodiment, the central control apparatus 50 gives the driver 53 instructions for the stopping position of the mobile element 12. For example the central control apparatus 50 gives the driver 53 instructions for the mobile element 12 stops in front of the wafer processing apparatus A. Then, the controller 51 performs feedback control based on the position data from the position sensors 54 in order to more precisely park the mobile element 12 at the stopping position indicated by the central control apparatus 50. The power is supplied from the driver 53 controlled by the controller 51 in this way to the excitation coil 42. As a result, the excitation coil 42 generates a magnetic field, thereby generating a propulsive force in conjunction with the magnet 41 (refer to FIG. 4) to drive the mobile element 12.

While FIG. 5 shows a case where the control data is superimposed on the electric current passing through the electricity supply line 43 for transmission to the mobile element 12, the invention is not so restricted, and it is possible, for example, to send the control data using publicly known optical communication means or radio communication means also provided on the guide rail 11. Additionally, if the distance of movement of the mobile element 12 is short, it is possible to employ a communication method wherein the control data from the central control apparatus 50 to the controller 51 is transmitted by means of cable with the use of cable bearers.

Figure 6:
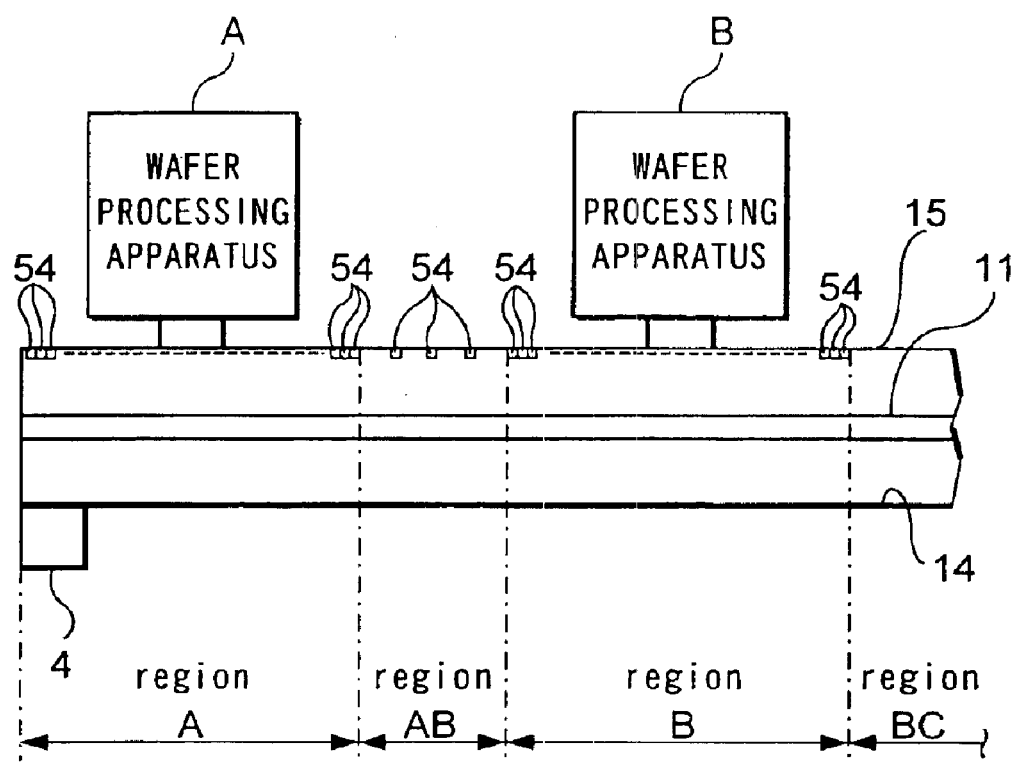
FIG. 6 is a diagram for explaining the arrangement of position sensors which are constituents of the above-mentioned control system.

FIG. 6 is a diagram showing the arrangement of position sensors 54 for performing position detection of the mobile element 12. As shown in FIG. 6, the position sensors 54 are positioned at the sides of the guide rail 11 in the partition panel 15. The position sensors 54 are arranged at a smaller spacing (e.g. every 50 μm to agree with the precision of the wafer transfer robot 13) at locations where the wafer transfer robot 13 exchanges wafers with the wafer processing apparatus (wafer exchange positions), positions where the wafer transfer robot 13 exchanges wafers with the cassettes 4, as well as the neighborhood thereof (regions A and B in the drawing), that is, in the area of positions where there is a possibility that the mobile element 12 will stop. As a result, it is possible to precisely detect the positions of the mobile element 12 in these areas. On the other hand, around the middle of each wafer processing apparatus (regions AB and BC in the drawing), that is, in the area of positions where there is no need for the mobile element 12 to stop, they are arranged with a large spacing. By densely arranging the position sensors 54 in the vicinity of positions requiring a high degree of precision for position detection and arranging position sensors 54 more sparsely at other locations, it is possible to precisely perform position control of the mobile element 12 as well as to suppress cost increases due to the arrangement of the position sensors 54. When making a chamber 14 having the position sensors 54, the portions in which the position sensors 54 are densely spaced (regions A and B) and the portions in which the position sensors 54 are sparsely spaced (regions AB and BC) can be made as separate units. And these units combined to make a chamber 14 as shown in FIG. 6. Of course, while the arrangement of the position sensors 54 can be as described above, the position sensors 54 may also be arranged to be equally spaced.

A-2. Wafer Conveyance Operation by Wafer Conveyance System

Next, the wafer conveyance operation by a wafer conveyance system having the structure described above shall be explained. Here, semiconductors are produced by performing processes on the wafers in the order of A–Z. First, unprocessed wafers are housed in a cassette 4 positioned on the upstream side of the conveyance direction which is the left side in FIG. 3. Then, the mobile element 12 moves along the guide rail 11 on the upstream side. The mobile element 12 stops near the cassette 4. And after the wafer transfer robot extracts a single wafer from the cassette 4, the mobile element 12 moves to stop at a position in front of the wafer processing apparatus A (wafer exchange position). Thereafter, the wafer transfer robot 13 sets the wafer extracted from the cassette 4 on the wafer insertion portion of the wafer processing apparatus A. When the wafer is set on the wafer processing apparatus, a predetermined process is performed on the set wafer by the wafer processing apparatus A.

The A-processed wafer which has been processed by the wafer processing apparatus A is extracted from the wafer insertion portion of the wafer processing apparatus A by the wafer transfer robot 13. Then, after the mobile element 12 moves to stop at a position in front of the wafer processing apparatus B (wafer exchange position), the wafer transfer robot 13 sets the A-processed wafer in the wafer insertion portion of the wafer processing apparatus B. When the wafer has been set, a predetermined process is performed on the wafer set by the wafer processing apparatus B.

The A-processed and B-processed wafer processed by the wafer processing apparatus B is extracted from the wafer processing apparatus B by the wafer transfer robot 13. Then, the mobile element 12 moves to stop at a position in front of the wafer processing apparatus C. Then, the wafer is conveyed through the sequence of wafer processing apparatus C, . . . , wafer processing apparatus Z as described above, in order to perform predetermined processes by means of the wafer processing apparatus. Then, a processed wafer which has been processed by the wafer processing apparatus Z, i.e. a wafer which has been completely processed, is extracted from the wafer insertion portion of the wafer processing apparatus Z by the wafer transfer robot 13. Then, the mobile element 12 moves, and stops at a position in front of the cassette 4 positioned at the downstream side (right side of FIG. 3) of the conveyance direction. The wafer which has been completely processed is housed in the cassette 4 by the wafer transfer robot 13. In this way, the processes A–Z are performed on the wafer.

Figure 1:
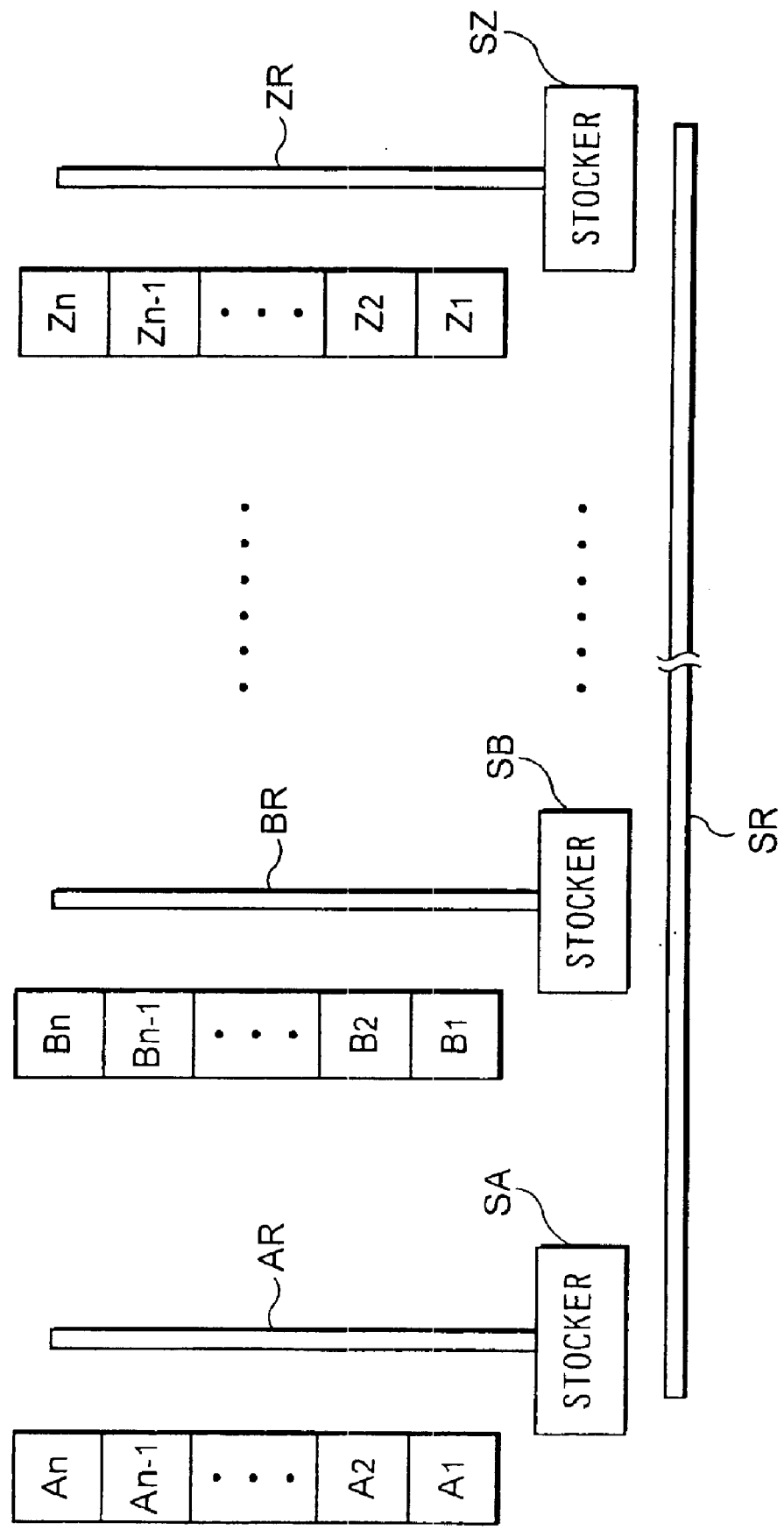
FIG. 1 is a schematic plan view showing an example of a semiconductor production equipment.
Figure 2:
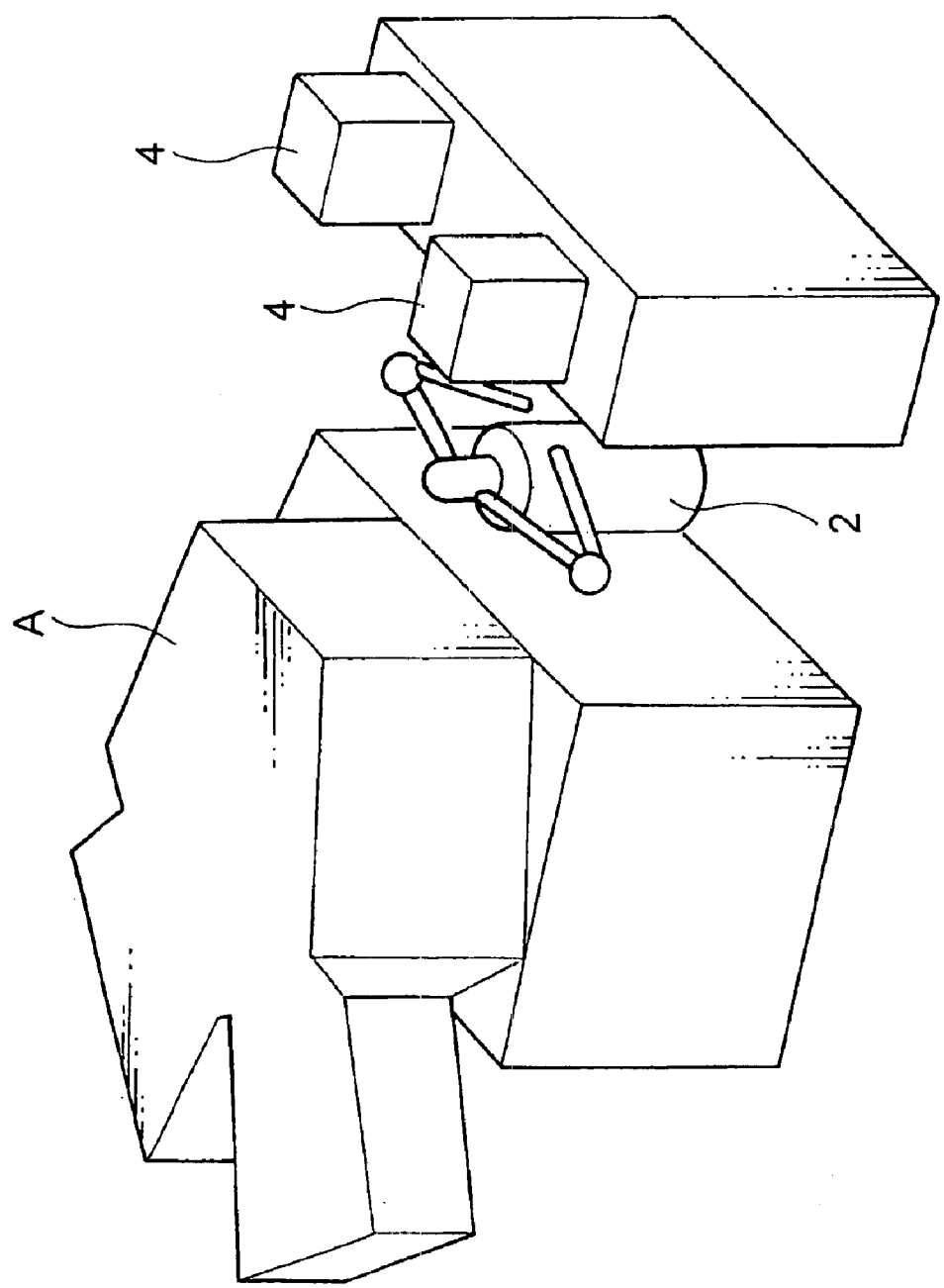
FIG. 2 is a drawing for explaining a method for setting a wafer onto a wafer processing apparatus in the semiconductor production equipment.

In the wafer conveyance system according to the present embodiment, the wafer transfer robot 13 which is made capable of moving between wafer processing apparatus are set in the wafer processing apparatus one wafer at a time. For this reason, after each of the above-mentioned processes has been completed, the processed wafer can immediately be set in the wafer processing apparatus to perform the next process. Therefore, the next process can be performed without having to wait for the processing of other wafers to be completed, or being stored in the stocker. Thus, in comparison to the above-described equipment (refer to FIG. 1), the time at which the last process is completed after performing the first process on the wafer, that is, the time until completion of a single product can be shortened. In particular, it is possible to reduce the time required until completion of a single product in comparison to existing systems when producing prototype products or a small amount of products. Additionally, it is possible to convey and process wafers without installing stockers for housing a plurality of cassettes 4.

Additionally, it is also possible to adapt the system to changed processing steps. For example, in the case that the processing procedure is changed according to the type of product such as by not performing process C, it is possible to adapt the system to changed processing steps, such as by making the mobile element 12 pass over the wafer processing apparatus C. Therefore, this wafer conveyance system is suited to use as a conveyance system used in small-scale production such as in the case of prototype products or system LSI. Additionally, since the time between the completion of one process and the commencement of the next process for a single wafer is shortened, it is possible to reduce cases in which dust adheres on the wafer or the wafer oxidizes after the cleansing process while waiting for the coating process, thus increasing the yield.

Additionally, when conveying wafers between a large number of wafer processing apparatus as described above, the conveyance distance, that is, the distance which the guide rail 11 is lain becomes large. When the path of movement of the mobile element 12 is long in this way, it is difficult to drive the mobile element 12 with a drive system using ball screws. However, by driving the mobile element 12 with a linear motor and performing non-contact electricity supply as in the present embodiment, the movement path of the mobile element 12 can be given a long stroke, thereby enabling the mobile element 12 to move between a large number of wafer processing apparatus as mentioned above. Additionally, since there are fewer frictional parts than systems using ball screws, the creation of dust is also reduced. Additionally, by performing feedback control using a linear motor system, it is possible to position the mobile element 12 at a high precision, thereby making it possible to exchange wafers which requires a high degree of precision.

Additionally, in the present embodiment, since the region over which the wafer is conveyed is only inside the chamber 14, it is sufficient to maintain a high degree of air purity only inside chamber 14 as a clean room. On the other hand, since the area over which the wafers are conveyed is wide in the existing equipment shown in FIG. 1, the entire factory inside which the equipment is provided must be made into a clean room. In contrast, in the present embodiment, it is sufficient to make the chamber 14 a clean room. Thus largely reducing the cost required to provide manufacturing equipment, and reducing the production costs of the product. Additionally, since it is no longer necessary to provide a wafer transfer apparatus for each wafer processing apparatus, the efficiency of installation space is improved. And, reducing the number of required devices and parts. Thus further reducing the cost of providing manufacturing equipment.

Furthermore, in the present embodiment, control data is supplied from the central control apparatus 50 to the mobile element 12 using the electricity supply line 43 for supplying power to the mobile element 12, thus simplifying the control system. Additionally, since the controller unit 20 having the controller 51 is attached to the mobile element 12, the control of the fine movement such as positioning of the mobile element can be performed on the mobile element 12, thus simplifying the control system. Additionally, the controller unit 20 is attached in either of the movable directions of the mobile element 12, so that there is no need to increase the area of the chamber 14, i.e. the clean room in the cross direction (up-down direction in FIG. 3), and increase of the cost due to providing manufacturing equipment can be suppressed.

A-3. Modification

Figure 7:
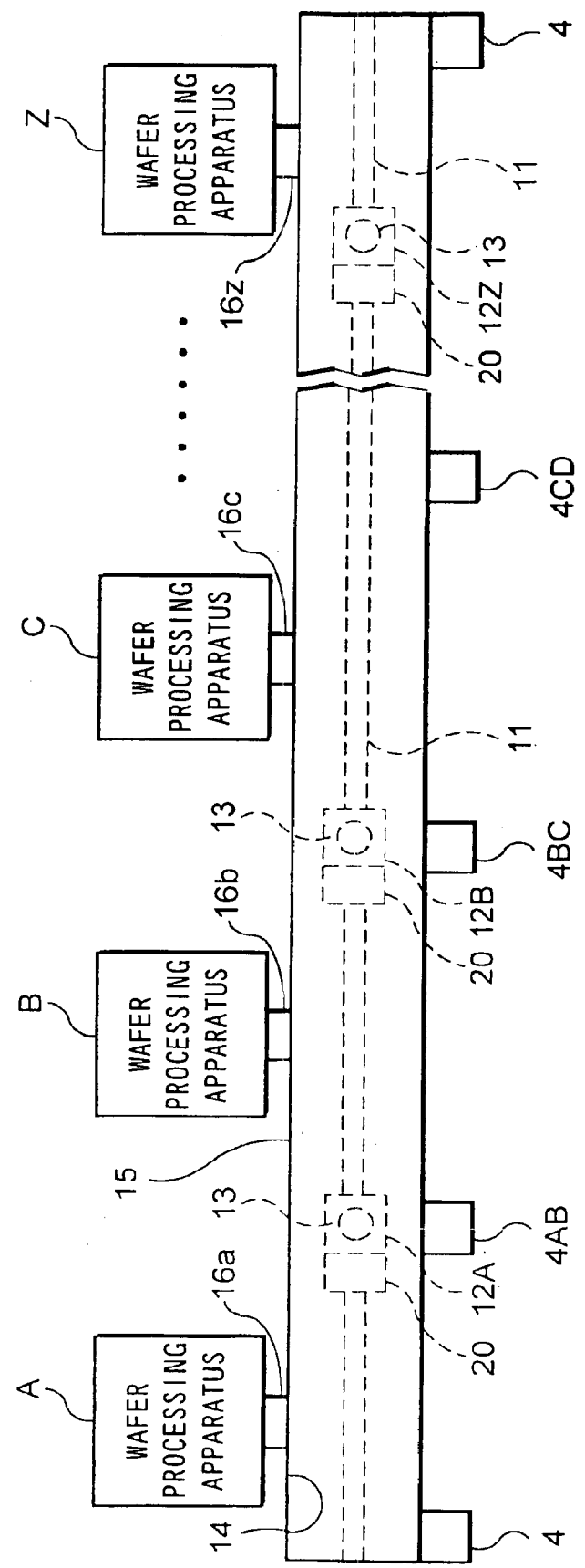
FIG. 7 is a schematic plan view showing semiconductor production equipment provided with a modification example of the wafer conveyance system according to the first embodiment.

In the above-described/first embodiment, there is only one mobile element 12 provided on the guide rail 11, but the invention is not so restricted and it is possible to position a plurality of mobile elements 12 on the guide rail 11. For example, as shown in FIG. 7, it is possible to have a mobile element 12A, a mobile element 12B, . . . , a mobile element 12Z corresponding to the wafer processing apparatus A, wafer processing apparatus B, . . . , wafer processing apparatus Z. In this case, the wafer transfer robot 13 provided on the mobile element 12A extracts a wafer from the cassette 4 on the left side in the drawing. And the wafer transfer robot 13 sets the wafer in the wafer processing apparatus A, and then extracts the A-processed wafer from the wafer processing apparatus A. And the wafer transfer robot 13 houses it in the cassette 4AB. Thereafter, the wafer transfer robot 13 mounted on the mobile element 12B extracts the A-processed wafer from the cassette 4AB and sets it on the wafer processing apparatus B. Then the wafer transfer robot 13 extracts the B-processed wafer from the wafer processing apparatus B and houses it in the cassette 4BC. In this way, the wafer transfer robot 13 mounted on each mobile element 12A, 12B, . . . exchanges wafers between a corresponding wafer processing apparatus and cassette. In this way, after a wafer is extracted from the cassette 4 which houses unprocessed wafers provided on the left side of the drawing and the processing at the wafer processing apparatus A is completed, it is possible to extract the next wafer from the cassette 4 and set it in the wafer processing apparatus A to perform wafer processing continuously, thereby making it possible to process a large number of wafers in a short time. Wafer transfer robots 13 mounted on adjacent mobile elements 12 can trade off wafers through cassettes in this way, and the mobile element 12 which has received a wafer can move to the wafer exchange position of the wafer processing apparatus for performing the next process, to set the wafer in this wafer processing apparatus.

Additionally, even when a plurality of mobile elements 12 are arranged as described above, the controller 51 mounted on each mobile element 12 can control the positioning of each in the present embodiment, so that there is no need to provide a control apparatus or the like outside of each mobile element, thus preventing the control system from becoming too complex.

Additionally, instead of providing a mobile element 12 for each wafer processing apparatus as described above, it is possible to provide a single mobile element 12 corresponding to a plurality of wafer processing apparatus, such as the three wafer processing apparatus from wafer processing apparatus A to wafer processing apparatus C. Additionally, it is possible to provide a plurality of mobile elements 12 on the guide rail 11 and have the central control apparatus 50 set the range which the mobile element 12 moves in accordance with the types of products to be manufactured. In the case where one of the mobile elements 12 has failed, it is possible to have the other mobile elements 12 cover the range of movement of that mobile element 12. When the range of movement of the mobile element 12 is made arbitrary, collisions between the mobile elements can be prevented by control of the controller 51 mounted on each mobile element 12 if they are made to be capable of detecting position data of the mobile elements moving in front thereof from the position data of the position sensors 54.

Additionally, in the above-described modification, the exchange of wafers is performed by providing cassettes between the wafer processing apparatus and having the wafer transfer robots 13 mounted on the mobile elements 12 exchange wafers through the cassettes. Aside from this way, wafers may be handed off directly between wafer transfer robots 13 mounted on adjacent mobile elements 12, and or to exchange wafers through simple wafer transfer stands instead of the cassettes.

Figure 8:
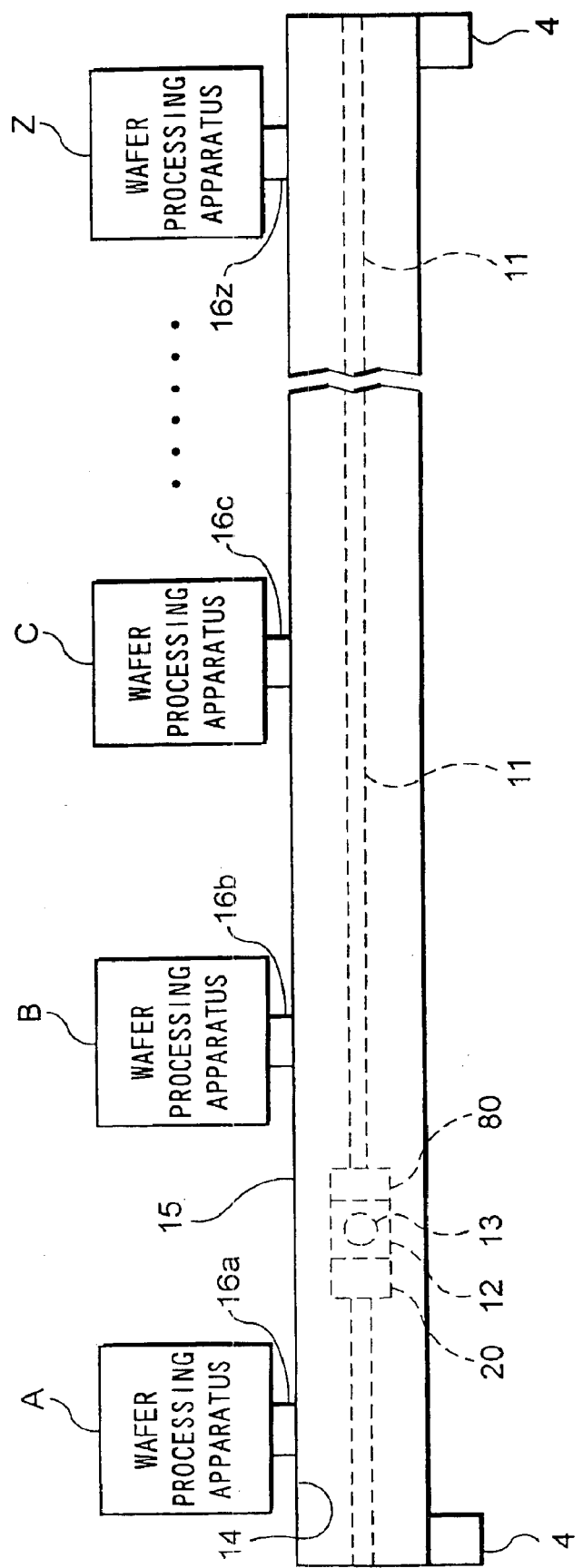
FIG. 8 is a schematic plan view showing semiconductor production equipment provided with another modification example of the wafer conveyance system according to the first embodiment.

Additionally, it is possible to provide a notch aligner (position-holding adjustment unit) 80 on the side of the mobile element 12 in the direction of movement, as shown in FIG. 8. The notch aligner 80 adjusts the orientation and position of the wafer, and various publicly known types may be employed. While wafers are formed in the shape of disks, there are cases in which a notch is formed in one portion thereof to determine the orientation when setting them in wafer processing apparatus. If the wafer processing apparatus do not have notch aligners, then the orientation and position of setting the wafer in the wafer processing apparatus must be adjusted. In this case, a notch aligner 80 can be provided as shown in the drawing. Additionally, if the notch aligner 80 is provided on the side of the direction of movement of the mobile element 12 as shown in the drawing, there is no need, as is the case with the above-mentioned controller unit 20, to increase the area of the clean room in the width direction, thus enabling increases in the equipment manufacturing costs to be suppressed.

B. Second Embodiment

Figure 9:
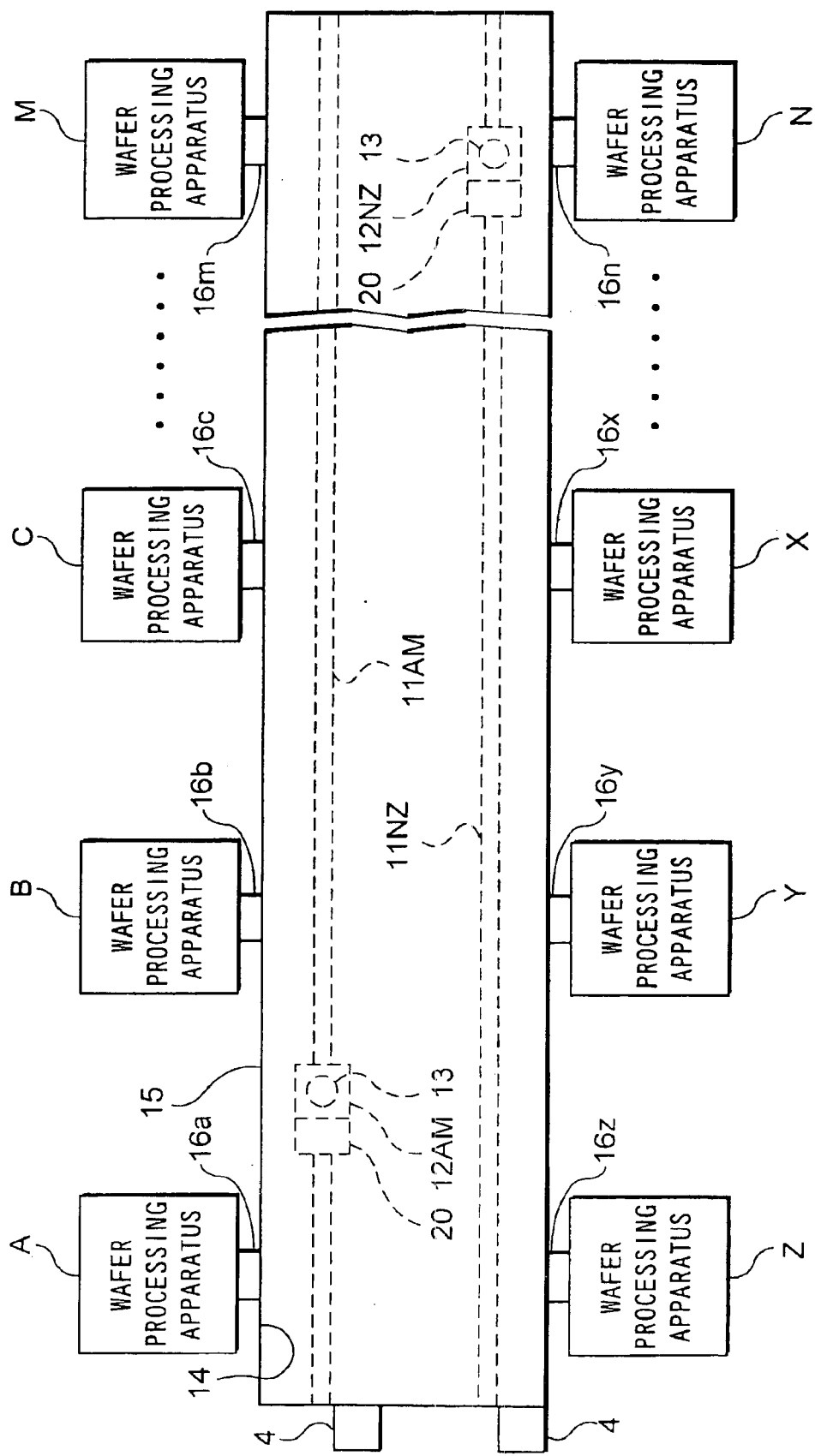
FIG. 9 is a schematic plan view showing semiconductor production equipment provided with a wafer conveyance system according to a second embodiment of the present invention.

Next, a wafer conveyance system according to a second embodiment of the present invention shall be explained with reference to FIG. 9. In the second embodiment, the elements which are common to those in the first embodiment are indicated by the same reference number and their explanation is omitted. As shown in the drawing, there are two rows of wafer processing apparatus in the second embodiment. In the top row in the drawing, wafer processing apparatus A, wafer processing apparatus B, . . . , wafer processing apparatus M are arranged in order from the left, and in the bottom row, wafer processing apparatus N, . . . , wafer processing apparatus X, wafer processing apparatus Y and wafer processing apparatus Z are arranged in order from the right.

In the second embodiment, two rows of guide rails 11AM, 11NZ are provided in correspondence to the wafer processing apparatus arranged in two rows, and a mobile element 12AM and a mobile element 12NZ are positioned movably on the respective guide rails 11AM and 11NZ. The mobile elements 12AM and 12NZ have the same structure as the mobile element 12 in the first embodiment, and are driven over the guide rail 11AM and guide rail 11NZ by means of a linear motor. Additionally, the mobile element 12AM and mobile element 12NZ both have a wafer transfer robot 13 and a controller unit 20 as in the first embodiment.

Since the guide rail 11AM and guide rail 11NZ are provided inside the chamber 14, the chamber 14 is shaped to be larger in the cross direction (up-down direction in the drawing) than in the first embodiment, but aside therefrom, the structure is the same as in the case of first embodiment. That is, the inside of the chamber 14 is a clean room having a higher air purity than the outside. Additionally, two cassettes 4 are provided on the left edge of the drawing outside the chamber 14. Here, the cassette 4 positioned on the guide rail 11AM side houses unprocessed wafers, and the cassette 4 on the guide rail 11NZ side houses processed wafers.

With this structure, the mobile element 12AM moves near the cassette 4 housing unprocessed wafers, in other words the mobile element 12AM moves to left edge of the drawing. Then, after the wafer transfer robot 13 mounted on the mobile element 12AM extracts an unprocessed wafer from the cassette 4, the mobile element 12AM moves to a position in front of the wafer processing apparatus A. Then the wafer transfer robot 13 sets the wafer extracted from the cassette 4 on the wafer insertion portion of the wafer processing apparatus A. The A-processed wafer is extracted from the wafer processing apparatus A by the wafer transfer robot 13. Then the mobile element 12AM moves to stop at a position in front of the wafer processing apparatus B.

Thereafter, the A-processed wafer is set inside the wafer insertion portion of the wafer processing apparatus B by means of the wafer transfer robot 13, and a predetermined process is performed by means of the wafer processing apparatus B. Then, after the B-processed wafer has been extracted from the wafer processing apparatus B by the wafer transfer robot 13, the mobile element 12AM moves to stop at a position in front of the wafer processing apparatus C, and exchanges wafers with the wafer processing apparatus C as with the wafer processing apparatus A and B. The same operation is performed through the wafer processing apparatus C–M Then, when a predetermined process has been performed on the wafer by means of the wafer processing apparatus M, an M-processed wafer is extracted from the wafer processing apparatus M by means of the wafer transfer robot 13. At this time, the mobile element 12NA positioned on the guide rail 11NZ has moved in front of the wafer processing apparatus N, and an M-processed wafer is transferred directly or through a temporary placement stand from the wafer transfer robot 13 of the mobile element 12AM to the wafer transfer robot 13 of the mobile element 12NZ. When the wafer transfer robot 13 of the mobile element 12NZ receives the M-processed wafers from the wafer transfer robot 13 of the mobile element 12AM, it sets the received wafer in the wafer insertion portion of the wafer processing apparatus N. Then, after a predetermined process has been performed by means of the wafer processing apparatus N, an N-processed wafer is extracted from the wafer processing apparatus N by means of the wafer transfer robot 13 of the mobile element 12NZ.

Thereafter, the mobile element 12NZ and wafer transfer robot 13 sequentially convey the wafer from the wafer processing apparatus O (not shown) to the wafer processing apparatus Z as the case with the above-mentioned mobile element 12AM. Then, after the Z-processed wafer has been extracted from the wafer processing apparatus Z, the mobile element 12NZ moves to the left edge of the drawing, and houses the wafer on which processes A–Z have been performed in the cassette 4. This cassette 4 houses the processed wafer by means of a wafer transfer robot 13.

In the wafer conveyance system according to the second embodiment, effects such as cost reduction of manufacturing equipment can be obtained as in the first embodiment. Additionally, mobile elements 12AM and 12NZ are provided for the respective guide rails 11AM and 11NZ. Therefore, the mobile element 12AM need only move between the wafer processing apparatus A and the wafer processing apparatus M, and the mobile element 12NZ need only move between the wafer processing apparatus N and the wafer processing apparatus Z, thus making it possible to begin process A with respect to the next wafer upon completion of process M, thereby reducing the wafer processing time. In this case, as explained in the above-described modification of the first embodiment, the processing time can be further reduced by positioning a plurality of mobile elements on each of the guide rails 11AM and 11NZ.

Additionally, when it is not necessary to perform processing with the wafer processing apparatus M due to the type of product, the wafer transfer robot 13 of the mobile element 12AM extracts a processed wafer from a wafer processing apparatus (not shown) positioned on the upstream side of the wafer processing apparatus M, and transfers the processed wafer to the wafer transfer robot 13 of the mobile element 12NZ. By doing this, processing steps corresponding to various products can be efficiently performed without any dependence on the sequence of the wafer processing apparatus.

C. Third Embodiment

Figure 10:
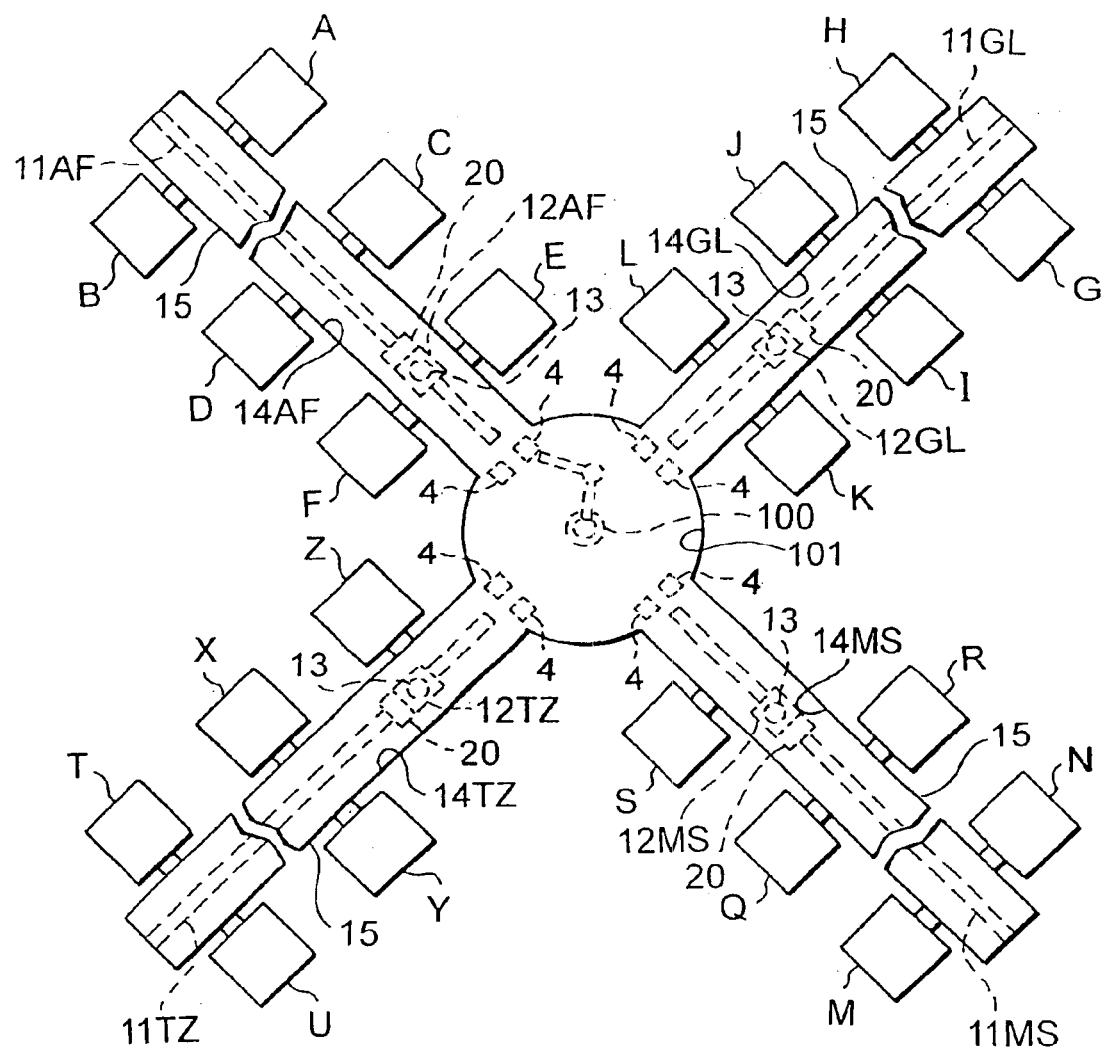
FIG. 10 is a schematic plan view showing semiconductor production equipment provided with a wafer conveyance system according to a third embodiment of the present invention.

Next, a wafer conveyance system according to a third embodiment of the present invention shall be explained with reference to FIG. 10. In the third embodiment, the elements which are common to those in the first embodiment and second embodiment shall be given the same reference numerals, and their explanation shall be omitted. As shown in the drawing, in the third embodiment, a wafer transfer robot 100 is fixed to a central portion. Chamber 101 is formed so as to surround the wafer transfer robot 100. With the respective chamber 14AF, chamber 14GL, chamber 14MS and chamber 14TZ being provided radially from around of the chamber 101. As in the first embodiment, FFU are provided at the tops (recto side of FIG. 10) of the chamber 101 and chambers 14AF 14GL, 14MS and 14TZ, so that the insides of these chambers are clean rooms having a higher degree of purity than the outside.

The wafer processing apparatus A–F are provided along the chamber 14AF, the wafer processing apparatus G–L are provided along the chamber 14GL, the wafer processing apparatus M–S are provided along the chamber 14MS, and the wafer processing apparatus T–Z are provided along the chamber 14TZ.

A guide rail 11AF is lain inside the chamber 14AF, and a mobile element 12AF is movably provided on the guide rail 11AF. As in the first embodiment, the mobile element 12AF is driven by a linear motor. Additionally, as in the first embodiment, a wafer transfer robot 13 and controller unit 20 are mounted on the mobile element 12AF, so as to be capable of exchanging wafers between the wafer processing apparatus A–F Since the chamber 14GL, chamber 14MS and chamber 14TZ have structures identical to that of chamber 14AF, their descriptions shall be omitted.

Two cassettes 4 are positioned on the wafer transfer robot 100 side, that is, the central side of each chamber. One of the cassettes 4 houses unprocessed wafers, while the other cassette 4 houses processed wafers. The wafer transfer robot 100 is capable of exchanging wafers between these cassettes 4.

With this structure, when processing the wafers in the order of A–Z, the wafer transfer robot 13 of the mobile element 12AF extracts a wafer from the cassette 4 housing unprocessed wafers positioned to the central side of the chamber 14AF. Then, after the mobile element 12AF has moved in front of the wafer processing apparatus A, the wafer transfer robot 13 sets a wafer inside the wafer insertion portion of the wafer processing apparatus A. When the wafer is set, the predetermined process is performed on the wafer by the wafer processing apparatus A, after which the A-processed wafer is extracted by the wafer transfer robot. Thereafter, the mobile element 12AF moves in front of the wafer processing apparatus B, after which the wafer transfer robot 13 sets the wafer in the wafer insertion portion of the wafer processing apparatus B to perform the process B on the wafer. Then, the B-processed wafer is extracted by the wafer transfer robot 13. Subsequently, the same operation is performed through the wafer processing apparatus C–F, and after being F-processed by the wafer processing apparatus F, the processed wafer is extracted from the wafer processing apparatus F by the wafer transfer robot 13. Then, the mobile element 12AF moves to the central side of the chamber 14AF, and houses the wafer which has undergone processes A–F in the cassette 4.

A wafer which has undergone processes A–F housed in the cassette 4 is extracted from the cassette 4 by means of the wafer transfer robot 100, and housed in the cassette 4 for unprocessed wafers on the central side of the chamber 14GL. Then, this wafer is extracted from the cassette 4 by a wafer transfer robot 13 mounted on a mobile element 12GL provided inside the chamber 14GL. Thereafter, the extracted wafer is conveyed in order that the wafer processing apparatus G–L in the same manner as for the operations for the wafer processing apparatus A–F. Then, the wafer which has undergone the processes of each wafer processing apparatus is housed in the processed cassette 4. Subsequently, the wafer is sequentially conveyed to the chamber 14MS and chamber 14TZ to complete all of the processes A–Z.

In the wafer conveyance system according to the third embodiment, just as in the above-described first embodiment, it is possible to gain the effects of reducing the cost of manufacturing equipment and shortening the production time. Additionally, when producing a plurality of types of products, if a certain product does not require processes M–S, then the wafer transfer robot 100 can be made to convey the wafers which have undergone processes A–L extracted from chamber 14GL to the chamber 14TZ. By skipping processing steps which are not required depending on the product in this way, the production time of the products can be further reduced.

While the chambers were arranged to radiate in four directions in the above third embodiment, it is possible to provide six or eight radial chambers, and the number of radially provided chambers is arbitrary. Additionally, it is possible to provide a plurality of mobile elements inside each radially arranged chamber.

D. Fourth Embodiment

Figure 11:
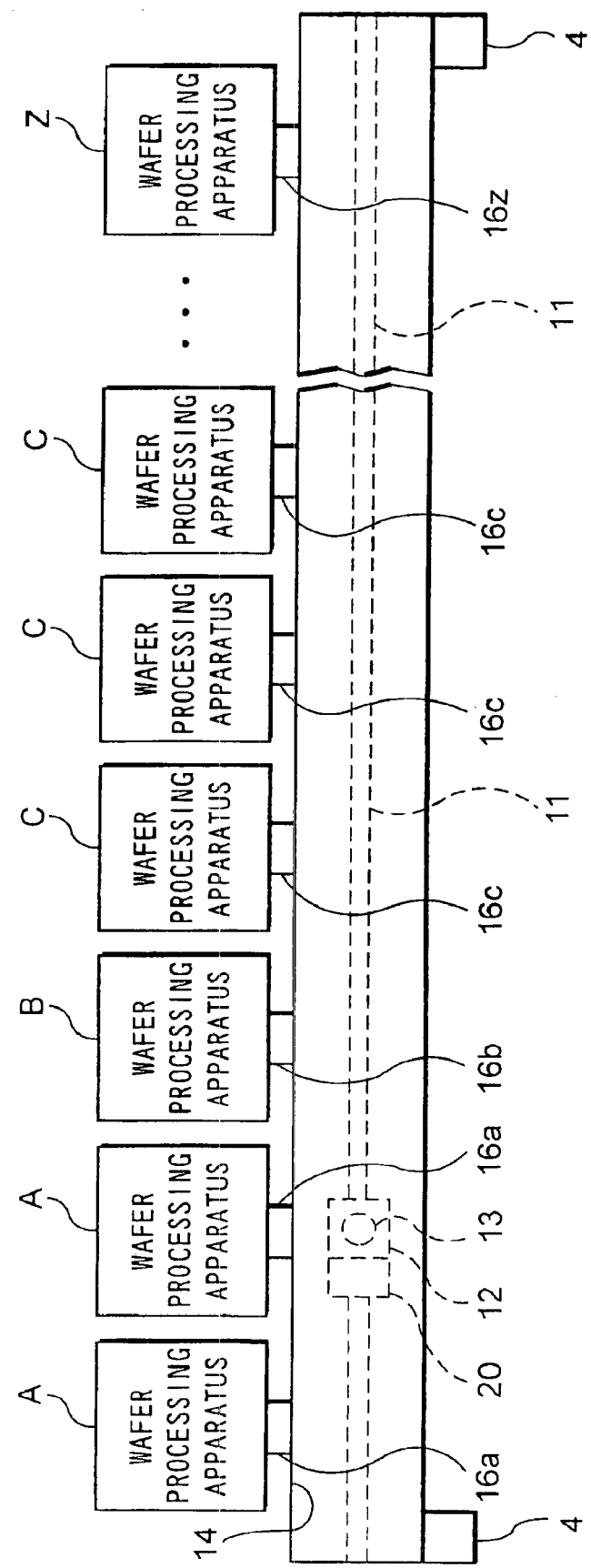
FIG. 11 is a schematic plan view showing semiconductor production equipment provided with a wafer conveyance system according to a fourth embodiment of the present invention.
Figure 12:
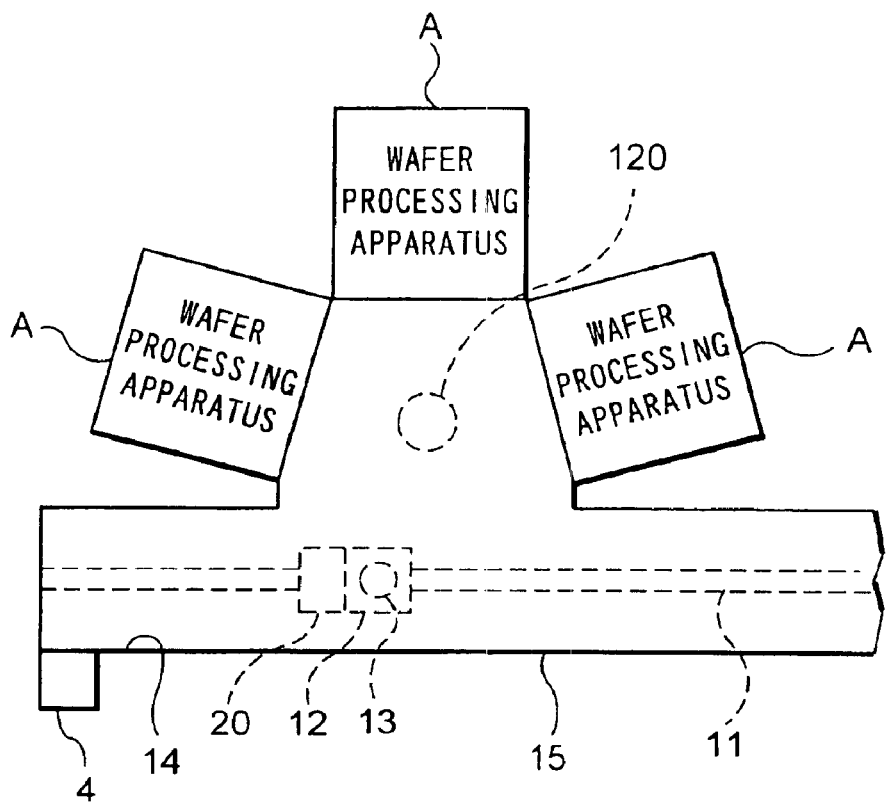
FIG. 12 is a schematic plan view showing a modification example of the wafer conveyance system according to the fourth embodiment.

Next, a wafer conveyance system according to a fourth embodiment of the present invention shall be explained with reference to FIG. 11. In the fourth embodiment, the elements common to those of the first through third embodiments shall be given the same reference numerals and their explanation shall be omitted. As shown in the drawing, the difference between the fourth and first embodiments is in that a plurality of wafer processing apparatus for performing the same process on the wafers are provided. In the present embodiment, two wafer processing apparatus A are positioned adjacent each other, and three wafer processing apparatus C are positioned adjacent each other. In this way, process A can be performed simultaneously with respect to two wafers, and process C can be performed simultaneously with respect to three wafers, thereby shortening the production time.

Additionally, in the present embodiment, the arrangement of wafer processing apparatus is for the case where the time required for process A in the wafer processing apparatus A is two minutes, the time required for process B in the wafer processing apparatus B is one minute and the time required for process C in the wafer processing apparatus C is three minutes. That is, in the present embodiment, a so-called tact system, that is, a system in which the wafer processing apparatus are provided such that the time required for each processing step from A–Z is the same, is used.

In the fourth embodiment, a plurality of the wafer processing apparatus for performing the same process are arranged in a single row, but the invention is not so restricted, and it is possible to arrange the wafer processing apparatus for performing the same process in an arcuate form. In this case, the wafer transfer robot 13 may be made to directly set the wafers in the wafer processing apparatus A, but it is also possible to provide a fixed wafer transfer robot 120 as shown in the drawing. And it is possible to transfer wafers from the wafer transfer robot 13 to the wafer transfer robot 120, and set the wafers from the wafer transfer robot 120 in the wafer processing apparatus A. In this way, it is possible to have the mobile element 12 stop at the wafer exchange position of the wafer processing apparatus A, so that the wafer transfer robot 13 will exchange wafers to the wafer processing apparatus A indirectly through the wafer transfer robot 120. Additionally, it is also possible not to have a tact system as described above, but instead to provide the same number, e.g. three, of each type of wafer processing apparatus.

E. Modification

Figure 13:
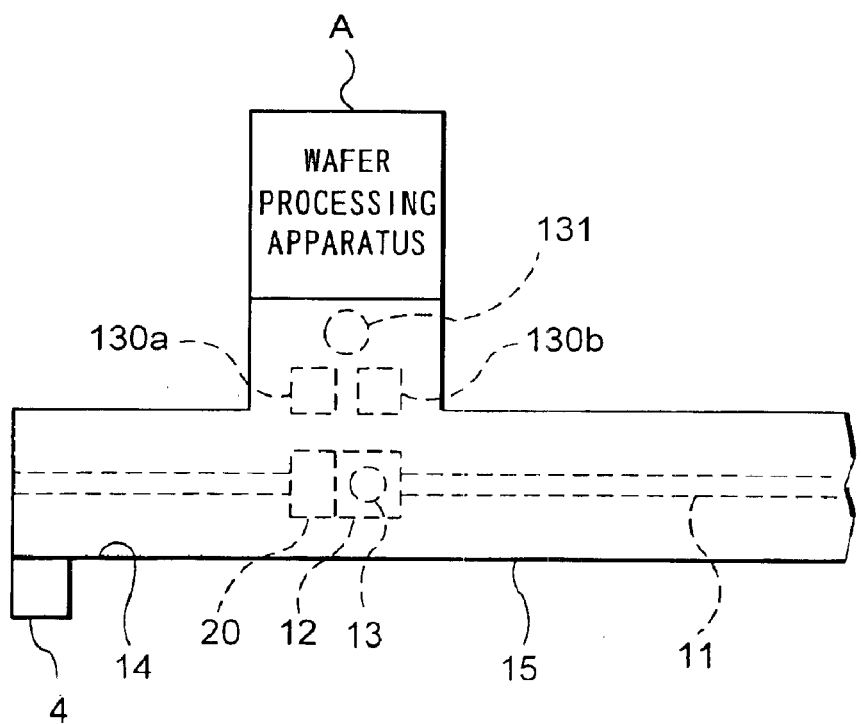
FIG. 13 is a schematic plan view showing a modification example of the wafer conveyance systems according to the first through fourth embodiments.

In the first through fourth embodiments, the wafer transfer robot 13 sets the wafers directly in each wafer processing apparatus, but the invention is not so restricted, and it is possible to provide, for each wafer processing apparatus, a buffer cassette 130a for temporarily storing unprocessed wafers and a buffer cassette 130b for temporarily storing processed wafers, as shown in FIG. 13. In this case, a wafer transfer robot 131 can be fixed between the buffer cassettes 130a, 130b and the wafer processing apparatus, and the wafers can be exchanged between the buffer cassettes 130a, 130b and the wafer processing apparatus. In this way, the wafer transfer robot 13 can be made to exchange wafers indirectly through the buffer cassettes and the wafer transfer robot 131.

In this way, the wafer transfer robot 13 can sequentially extract unprocessed wafers and accumulate them in the buffer cassette 130a. In this case, if the wafer transfer robot 13 is made to be able to simultaneously hold a plurality of wafers, a large number of wafers can be conveyed more quickly. While the wafers are sequentially collected in the buffer cassette 130a in this way, the wafer transfer robot 131 extracts a single wafer from the buffer cassette 130a and sets it in the wafer processing apparatus A to perform the process A. Then, when the process A has been completed, the processed wafer is extracted from the wafer processing apparatus A by the wafer transfer robot 131, and collected in the buffer cassette 130b. After the A-processed wafers are collected in the buffer cassette 130b, the wafer transfer robot 131 extracts the wafer accumulated in the buffer cassette 130a and sets it in the wafer processing apparatus A. At this time, an A-processed wafer is extracted from the buffer cassette 130b by means of the wafer transfer robot 13, and is collected in a buffer cassette for housing unprocessed wafers provided for the wafer processing apparatus B not shown. By repeating this operation, the wafers are conveyed to the wafer processing apparatus in order to undergo each of the processes. As a result, it is possible to reduce the production time.

What is claimed is:

1. A wafer conveyance system for transporting one or more wafers that undergo, while being transported, different processes at a plurality of wafer processing apparatuses inside which one or more wafers are processed, the wafer conveyance system comprising:

(a) a hermetically closed chamber that defines an isolated environment inside which a controlled atmosphere is provided;

(b) at least one guide path provided inside the hermetically closed chamber;

(c) a plurality of ducts that each communicate the isolated environment of the hermetically closed chamber with the inside of one wafer processing apparatus such that the hermetically closed chamber is in communication with one or more wafer processing apparatuses;

(d) at least one mobile element being movable inside the hermetically closed chamber along the at least one guide path to transport one or more wafers from one wafer processing apparatus to another;

(e) at least one arm provided on each mobile element, each arm being accessible to the inside of each wafer processing apparatus through a corresponding duct to load one or more wafers into a wafer processing apparatus and unload the same therefrom; and (f) a plurality of position sensors that detect positions of the at least one mobile element, the position sensors being deployed along each of the at least one guide path in such a manner that they are deployed at intervals of about 50 $\mu$m near the wafer processing apparatuses while at wider intervals elsewhere.

2. A conveyance system in accordance with claim 1, wherein the at least one mobile element is driven by a linear motor.

3. A conveyance system in accordance with claim 2, further comprising a power supply element provided along at least one guide path; wherein an electric power is supplied to the at least one mobile element by means of the power supply element.

4. A conveyance system in accordance with claim 3, wherein the power supply element comprises an electric cable provided along the at least one guide path, and an electricity receiving element provided on the at least one mobile element for receiving the electric power supplied to the electric cable without contact, whereby electric power is supplied to the at least one mobile element without contact.

5. A conveyance system in accordance with claim 4, further comprising:
    a control element for generating control data for operating the at least one mobile element;
    a communication element provided on the at least one mobile element for performing data communication between the control element and the at least one mobile element; and
    a mobile element control unit provided on the at least one mobile element for operating the at least one mobile element based on the control data supplied from the control element through the communication element.

6. A conveyance system in accordance with claim 5, wherein the control element supplies electrical signals containing the control data through the electric cable provided along the at least one guide path; and the communication element receives the electrical signals containing the control data supplied through the electric cable by means of the control element.

7. A conveyance system in accordance with claim 5, wherein the communication element is selected from the group consisting of an optical communication element, a radio communication element and a cable communication element provided along the at least one guide path.

8. A conveyance system in accordance with claim 5, wherein the mobile element control unit is attached to the mobile element on leading side of the mobile element.

9. A conveyance system in accordance with claim 5, wherein the control element generates the control data based on detection results from the position sensors and wafer conveyance requests from the wafer processing apparatus.

10. A conveyance system in accordance with claim 1, wherein at least one guide path comprises a first magnetic field generating element for generating a magnetic field; and at least one mobile element comprises a second magnetic field generating element for generating a magnetic field, forming a linear motor in conjunction with the first magnetic field generating element, and conferring a propulsive force to the at least one mobile element.

11. A conveyance system in accordance with claim 1, wherein the degree of air purity in said chamber is higher than the degree of purity outside said chamber.

* * * * *

UNITED STATES PATENT AND TRADEMARK OFFICE
CERTIFICATE OF CORRECTION

PATENT NO.   : 6,863,485 B2
DATED        : March 8, 2005
INVENTOR(S)  : Takumi Mizokawa et al.

It is certified that error appears in the above-identified patent and that said Letters Patent is hereby corrected as shown below:

<u>Title page,</u>
Item [56], References Cited, FOREIGN PATENT DOCUMENTS, delete "WO98/19733" and substitute -- WO98/19333 -- in its place.

Signed and Sealed this

Twenty-seventh Day of September, 2005

JON W. DUDAS
*Director of the United States Patent and Trademark Office*